(12) United States Patent
Xiang et al.

(10) Patent No.: US 11,210,970 B2
(45) Date of Patent: Dec. 28, 2021

(54) FOLDABLE DISPLAY DEVICE

(71) Applicants: BOE Technology Group Co., Ltd., Beijing (CN); Beijing BOE Optoelectronics Technology Co., Ltd., Beijing (CN)

(72) Inventors: Desheng Xiang, Beijing (CN); Jiaqiang Wang, Beijing (CN); Yanming Wang, Beijing (CN); Shuainan Liu, Beijing (CN); Yadong Zhang, Beijing (CN); Jianye Tang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 888 days.

(21) Appl. No.: 15/775,589

(22) PCT Filed: Oct. 18, 2017

(86) PCT No.: PCT/CN2017/106633
§ 371 (c)(1),
(2) Date: May 11, 2018

(87) PCT Pub. No.: WO2018/196295
PCT Pub. Date: Nov. 1, 2018

(65) Prior Publication Data
US 2021/0174709 A1    Jun. 10, 2021

(30) Foreign Application Priority Data
Apr. 24, 2017 (CN) .......................... 201710272778.1

(51) Int. Cl.
G09F 9/00 (2006.01)
G09F 9/30 (2006.01)
(Continued)

(52) U.S. Cl.
CPC ............ G09F 9/301 (2013.01); G06F 1/1616 (2013.01); G06F 1/1652 (2013.01); H05K 1/028 (2013.01);
(Continued)

(58) Field of Classification Search
CPC ...... G09F 9/301; G06F 1/1616; G06F 1/1652; H05K 1/028; H05K 1/189; H05K 2201/1012
See application file for complete search history.

(56) References Cited

U.S. PATENT DOCUMENTS 7,868,545 B2    1/2011  Hioki et al.
9,164,547 B1 *  10/2015 Kwon ................... G06F 1/1656
(Continued)

FOREIGN PATENT DOCUMENTS

CN    204331666 U    5/2015
CN    104714699 A    6/2015
(Continued)

OTHER PUBLICATIONS

Chinese Office Action for Chinese Application No. 201710272778.1 dated Oct. 26, 2018.
(Continued)

*Primary Examiner* — Pete T Lee
(74) *Attorney, Agent, or Firm* — Fay Sharpe LLP

(57) ABSTRACT

A foldable display device is provided. The foldable display device includes: a supporting plate and a flexible display screen arranged on the supporting plate. The supporting plate includes at least two supporting sub-plates and at least one restraining structure, in which the restraining structure
(Continued)

is configured to connect target side surfaces of adjacent supporting sub-plates, and the target side surfaces are lateral surfaces at edges of the flexible display screen. The restraining structure includes at least two sub restraining structures and a first flexible strap configured to connect adjacent inward-bend restraining structures. When the flexible display screen is bent away from the supporting plate, the at least two sub restraining structures are capable of restraining relative positions of the adjacent supporting sub-plates. The damages to the flexible display screen may be reduced by restraining the positions through the at least two sub restraining structures.

18 Claims, 9 Drawing Sheets

(51) Int. Cl.
   *G06F 1/16* (2006.01)
   *H05K 1/02* (2006.01)
   *H05K 1/18* (2006.01)
(52) U.S. Cl.
   CPC ... *H05K 1/189* (2013.01); *H05K 2201/10128* (2013.01)

(56) References Cited

U.S. PATENT DOCUMENTS

| | | | | |
|---|---|---|---|---|
| 9,173,287 | B1* | 10/2015 | Kim | G06F 1/1616 |
| 9,317,067 | B2* | 4/2016 | Choi | G06F 1/1677 |
| 9,348,362 | B2* | 5/2016 | Ko | G06F 1/1626 |
| 2014/0042406 | A1* | 2/2014 | Degner | H05K 1/028 257/40 |
| 2014/0123436 | A1* | 5/2014 | Griffin | H04M 1/0216 16/221 |
| 2014/0355227 | A1* | 12/2014 | Lim | G02F 1/13452 361/749 |
| 2015/0089974 | A1 | 4/2015 | Seo et al. | |
| 2015/0195936 | A1* | 7/2015 | Park | H01L 51/0097 361/749 |
| 2017/0207516 | A1* | 7/2017 | Koo | H01Q 9/42 |
| 2018/0124931 | A1* | 5/2018 | Choi | H05K 5/0217 |
| 2019/0174645 | A1* | 6/2019 | Jeon | G06F 1/1681 |

FOREIGN PATENT DOCUMENTS

| | | |
|---|---|---|
| CN | 104851365 A | 8/2015 |
| CN | 104900149 A | 9/2015 |
| CN | 105788452 A | 7/2016 |
| CN | 105810104 A | 7/2016 |
| CN | 106455371 A | 2/2017 |
| CN | 206097002 U | 4/2017 |
| CN | 106847099 A | 6/2017 |
| EP | 2479658 A1 | 7/2012 |
| EP | 2902870 A2 | 8/2015 |

OTHER PUBLICATIONS

International Search Report for PCT Application No. PCT/CN2017/106633 dated Jan. 19, 2018.

* cited by examiner

FOLDABLE DISPLAY DEVICE

This application is a 371 of PCT Patent Application Serial No. PCT/CN2017/106633 filed Oct. 18, 2017, which claims priority to Chinese Patent Application No. 201710272778.1, filed with the State Intellectual Property Office on Apr. 24, 2017 and titled "FOLDABLE DISPLAY DEVICE," the entire contents of which are incorporated herein by reference.

TECHNICAL FIELD

The present disclosure relates to a foldable display device.

BACKGROUND

With the continuous development of communication technology, mobile display devices, such as mobile phones and intelligent wearable devices, (for example, smart watches or smart bracelets) are widely used. To guarantee the portability of display devices, some foldable display devices have emerged.

Traditional foldable display devices can achieve the folding function through an articulated connection based on flexible display screens. For example, a foldable display device comprises a folding shaft and supporting plates located on two sides of the folding shaft. The flexible display screen covers the folding shaft and the supporting plates. Any part, covering the supporting plates, of the flexible display screen can rotate around the folding shaft along with the supporting plates to realize the folding of the display device.

However, during the folding of the foldable display device employing the articulated connection, when the flexible display screen is inward bent by an excessively large angle (the angle of bending away from the supporting plates is excessively large), the problem that the flexible display screen is damaged by the excessive bending of the flexible display screen may arise.

SUMMARY

Embodiments of the present disclosure provide a foldable display device capable of solving the problem that the flexible display screen is damaged by the excessive bending of the flexible display screen when the flexible display screen is inward bent by an excessively large angle in the prior art. The technical solutions are as follows:

There is provided a foldable display device, comprising: a supporting plate and a flexible display screen arranged on the supporting plate; wherein the supporting plate comprises at least two supporting sub-plates and at least one restraining structure, wherein the restraining structure is configured to connect target side surfaces of adjacent supporting sub-plates, and the target side surfaces are lateral surfaces at edges of a display surface of the flexible display screen; the restraining structure comprises at least two inward-bend restraining structures and a first flexible strap configured to connect adjacent inward-bend structures; and when the flexible display screen is bent away from the supporting plate, the at least two sub restraining structures are capable of restraining relative positions of the adjacent supporting sub-plates.

In some embodiments, in each restraining structure, when the flexible display screen at the restraining structure is in an unfolded state, the side, facing the flexible display screen, of each of the sub restraining structures at the restraining structure is a plane, and when the flexible display screen at the restraining structure is bent away from the supporting plate, the sides, facing the flexible display screen, of all the sub restraining structures in the restraining structure are combined to form a curved surface of which the bending degree matches with the bending degree of the flexible display screen.

In some embodiments, each of the sub restraining structures comprises a first cubic structure and a first quad-prismoid arranged on a first surface of the first cubic structure, wherein the bottom surface, with a larger area, of the two bottom surfaces of the first quad-prismoid is connected with the first surface of the first cubic structure; the bottom surface with a smaller area is in contact with the flexible display screen; a first longitudinal section of the first quad-prismoid is trapezoidal; and the first longitudinal section is a section parallel to the extending direction of the first flexible strap and perpendicular to the display surface of the flexible display screen.

In some embodiments, the first longitudinal section of the first quad-prismoid is in the shape of an isosceles trapezoid of which base angles are greater than 72 degrees.

In some embodiments, the target side surface of the supporting sub-plate connected with the inward-bend restraining structure comprises a first inclined plane and a first vertical plane. When the flexible display screen is bent away from the supporting plate, the first inclined plane is attached to a side surface of the first quad-prismoid, and when the flexible display screen is in an unfolded state, the first vertical plane is attached to a side surface of the first cubic structure.

In some embodiments, each of the sub restraining structures further comprises a second quad-prismoid arranged on a second surface of the first cubic structure. The bottom surface, with a larger area, of the two bottom surfaces of the second quad-prismoid is connected with the second surface of the first cubic structure. The second surface is opposite to the first surface. The second longitudinal section of the second quad-prismoid is trapezoidal. The target side surface of the supporting sub-plate connected with the inward-bend restraining structure comprises a second inclined plane, which is attached to a side surface of the second quad-prismoid when the flexible display screen is bent toward the supporting plate until the surfaces of the two supporting sub-plates are attached to each other.

In some embodiments, the restraining structure comprises at least two outward-bend restraining structures and a second flexible strap configured to connect adjacent outward-bend restraining structures. When the flexible display screen is bent toward the supporting plate until the surfaces of the two supporting sub-plates are attached to each other, the at least two outward-bend restraining structures are capable of restraining relative positions of the two supporting sub-plates.

In some embodiments, a second surface of the second cubic structure is in contact with the flexible display screen and is opposite to the first surface.

In some embodiments, a trapezoid formed by the first longitudinal section of the third quad-prismoid is an isosceles trapezoid of which base angles range from 60 degrees to 90 degrees.

In some embodiments, the target side surface of the supporting sub-plate connected with the sub restraining structure comprises a third inclined plane and a second vertical plane; when the flexible display screen is bent toward the supporting plate until the surfaces of the two supporting sub-plates are attached to each other, the second inclined plane is attached to a side surface of the third quad-prismoid; and when the flexible display screen is in an unfolded state, the second vertical plane is attached to a side surface of the second cubic structure.

In some embodiments, the at least two supporting sub-plates comprise a plurality of supporting sub-plates arranged in a matrix when the flexible display screen is in an unfolded state. The plurality of supporting sub-plates comprise n-row and m-column supporting sub-plates, and both m and n are integers greater than 1.

When the flexible display screen is in the unfolded state, a gap is formed between two adjacent supporting sub-plates, which are not connected through the restraining structure, of the supporting sub-plates, and clearances are formed in positions on the flexible display screen corresponding to the gaps.

The widths of the restraining structures are smaller than the widths of the supporting sub-plates which are connected through the restraining structures.

In some embodiments, the plurality of supporting sub-plates are connected through the restraining structures to form an S-shaped structure.

In some embodiments, the flexible display screen is a transparent screen, and a preset pattern is formed on a side, close to the flexible display screen, of the supporting plate.

In some embodiments, the supporting plate and the restraining structures are made of a transparent material.

In some embodiments, the foldable display device further comprises a flexible printed circuit FPC, wherein a driver control chip of the flexible display screen is arranged on the FPC; one end of the FPC is electrically connected with one side of the flexible display screen; and the other end of the FPC is bent to one side, away from the flexible display screen, of the supporting plate.

In some embodiments, the foldable display device further comprises a flexible protective shell, which coats the supporting plate, the FPC and the edge of the flexible display screen.

In some embodiments, the foldable display device further comprises a signal output component, wherein the signal output component is provided with a signal output port. The signal output port is in a detachable connection with a signal input port of the flexible display screen, and the signal output component is configured to provide the flexible display screen with a display signal.

In some embodiments, the foldable display device further comprises a power supply component configured to supply power for the flexible display screen.

In some embodiments, the power supply component comprises a power input port connected with an external power supply; and/or a power supply battery.

The technical solutions provided by the present disclosure may include the following advantageous benefits: in accordance with the foldable display device provided by the embodiments of the disclosure, when the flexible display screen is bent away from the supporting plate, two sides of the at least two sub restraining structures are propped against the supporting sub-plates, so that when the flexible display screen is bent to a certain degree, the at least two sub restraining structures perform restraintto avoid excessive bending. Therefore, damages to the flexible display screen may be reduced.

BRIEF DESCRIPTION OF THE DRAWINGS

FIG. 1-2 is a schematic diagram of a partial structure of the foldable display device shown in FIG. 1-1 after being folded;

FIG. 1-3 is a structural schematic diagram of an inward-bend restraining structure provided in an embodiment of the present disclosure;

FIG. 1-4 is a structural schematic diagram of another foldable display device provided in an embodiment of the present disclosure;

FIG. 2-1 is a structural schematic diagram of a supporting plate provided in an embodiment of the present disclosure;

FIG. 2-2 is a structural schematic diagram of a flexible display screen provided in an embodiment of the present disclosure;

FIG. 3-1 is a structural schematic diagram of yet another foldable display device provided in an embodiment of the present disclosure;

FIG. 3-2 is a structural schematic diagram of an outward-bend restraining structure provided in an embodiment of the present disclosure;

FIG. 4 is a structural schematic diagram of still yet another foldable display device provided in an embodiment of the present disclosure;

FIG. 6-1 is a structural schematic diagram of a foldable display device after being folded provided in an embodiment of the present disclosure;

FIG. 6-2 is a structural schematic diagram of a foldable display device after being unfolded provided in an embodiment of the present disclosure FIG. 7-1 is a structural schematic diagram of another foldable display device after being folded provided in an embodiment of the present disclosure;

FIG. 7-2 is a display diagram of a foldable display device provided in an embodiment of the present disclosure;

FIG. 7-3 is a display diagram of another foldable display device provided in an embodiment of the present disclosure;

FIG. 7-4 is a display diagram of yet another foldable display device provided in an embodiment of the present disclosure;

FIG. 8-1 is a structural schematic diagram of a foldable display device provided in an exemplary embodiment of the present disclosure;

FIG. 8-2 is a structural schematic diagram of another foldable display device provided in an exemplary embodiment of the present disclosure;

FIG. 8-3 is a structural schematic diagram of yet another foldable display device provided in an exemplary embodiment of the present disclosure;

FIG. 8-4 is a structural schematic diagram of still yet another foldable display device provided in an exemplary embodiment of the present disclosure.

DETAILED DESCRIPTION

The present disclosure will be described in further detail with reference to the enclosed drawings, to clearly present the objects, technical solutions, and advantages of the present disclosure.

Figure 1:
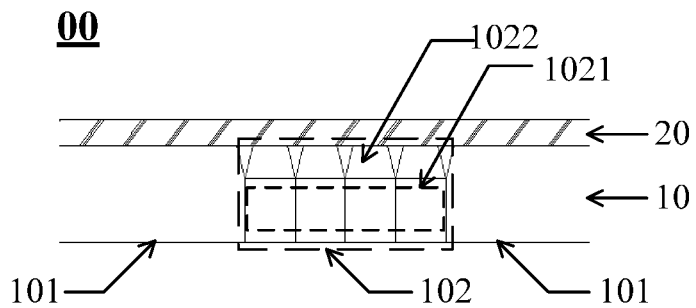
FIG. 1-1 is a structural schematic diagram of a foldable display device provided in an embodiment of the present disclosure.

The present disclosure provides a foldable display device 00. The foldable display device 00 can protect and support the flexible display screen and can realize matrix folding. As shown in FIG. 1-1, the device 00 may comprise: a supporting plate 10 and a flexible display screen 20 arranged on the supporting plate 10. Exemplarily, the flexible display screen 20 may be a Flexible Organic Light Emitting Diode (FOLED) display screen, a Flexible Electrophoretic Display (FEPD) display screen or a Flexible Liquid Crystal Display (FLCD) display screen.

The supporting plate 10 comprises at least two supporting sub-plates 101 and at least one restraining structure 102. The restraining structure 102 is configured to connect target side surfaces of adjacent supporting sub-plates 101, and the target side surfaces are not parallel with the display surface of the flexible display screen 20. For example, the target side surfaces may include at least one surface perpendicular to the display surface of the flexible display screen 20. It should be noted that in the present disclosure, the restraining structure is configured to fold the foldable display device. Based on the restraining structure, the foldable display device may realize at least one of the bending modes of being inward-bent and being outward-bent. The restraining structure comprises at least two sub restraining structures and a first flexible strap configured to connect adjacent sub restraining structures. The subsequent embodiments of the present disclosure are illustrated by taking an example in which the restraining structure comprises inward-bend restraining structures and outward-bend restraining structures and the restraining structure is not limited hereto.

Figures 1, 2:
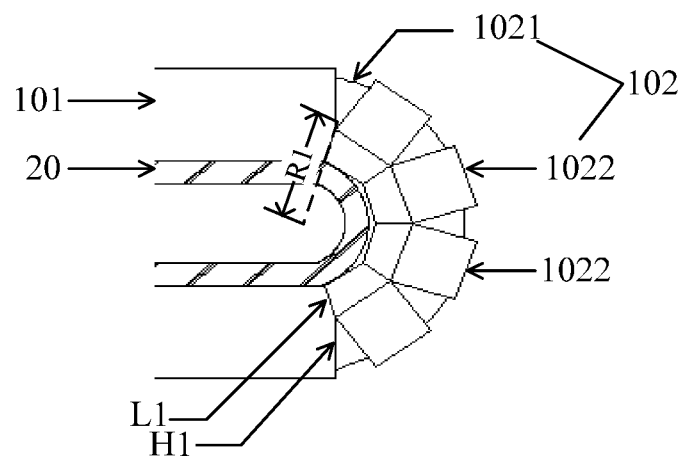
Figures 1, 2, 3:
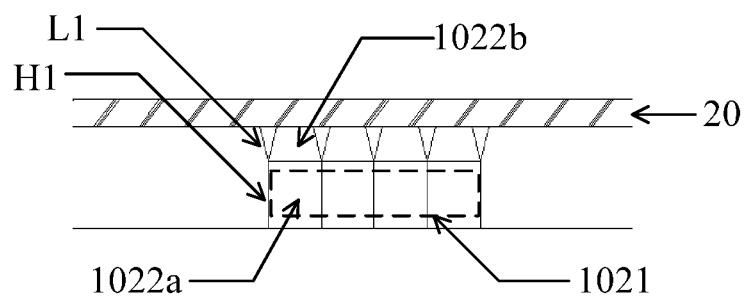

FIG. 1-2 is a structural schematic diagram of a partial structure of the foldable display device 00 shown in FIG. 1-1 after it's folded. As shown in FIG. 1-2, the restraining structure 102 may comprise at least two inward-bend restraining structures 1022 and a first flexible strap 1021 configured to connect adjacent inward-bend restraining structures 1022. When the flexible display screen 20 is bent to a preset angle away from the supporting plate 10, the at least two inward-bend restraining structures 1022 are capable of restraining relative positions of the adjacent supporting sub-plates 101. That is, the inward-bend restraining structure may fix the adjacent supporting sub-plates. The preset angle may be 0 degree to 180 degrees. The structure of the inward-bend restraining structure 1022 may be made reference to FIG. 1-3. As shown in FIG. 1-3, each of the inward-bend restraining structures 1022 may comprise: a first cubic structure 1022a and a first quad-prismoid 1022b arranged on the first surface of the first cubic structure 1022a.

In some embodiments, the first flexible strap may be made of a deformable material with a "viscoelastic property", for example, rubber, resin, etc.

In practice, the adjacent inward-bend restraining structures may be connected through the first flexible strap in various ways. Exemplarily, the first way is as shown in FIG. 1-1: two adjacent supporting sub-plates 101 may be connected through a first flexible strap 1021, and the inward-bend restraining structures 1022 may sleeve the first flexible strap 1021. For example, a through groove is formed in each inward-bend restraining structure 1022, and the inward-bend restraining structures 1022 are connected in series through the through grooves on the first flexible strap 1021. The second way is as shown in FIG. 1-4: the first flexible strap 1021 may comprise a plurality of flexible sub-straps, and two adjacent inward-bend restraining structures 1022 may be connected through one of the first flexible sub-straps, and the two inward-bend restraining structures 1022 adjacent to the supporting sub-plate may be respectively connected with the corresponding supporting sub-plates 101 through one of the first sub-straps. The way to connect the inward-bend restraining structures and the first flexible straps is not limited in the embodiments of the disclosure.

In conclusion, in accordance with the foldable display device provided by the embodiments of the disclosure, when the flexible display screen is bent to a preset angle away from the supporting plate, two sides of the at least two inward-bend restraining structures are propped against the supporting sub-plates, so that when the flexible display screen is bent to a certain degree, the at least two inward-bend restraining structures perform restraint to avoid excessive bending. Therefore, damages to the flexible display screen may be reduced.

In some embodiments, the at least two supporting sub-plates may comprise a plurality of supporting sub-plates arranged in a matrix when the flexible display screen is in an unfolded state. The plurality of supporting sub-plates may comprise n-row and m-column supporting sub-plates, wherein both m and n are integers greater than 1. Exemplarily, as shown in FIG. 2-1, a supporting plate 10 comprises a plurality of supporting sub-plates which may include three-row three-column nine supporting plates. The nine supporting sub-plates may be respectively marked with 101a, 101b, 101c, 101d, 101e, 101f, 101g, 101h and 101i. When the flexible display screen is in the unfolded state, a gap γ is formed between every two adjacent supporting sub-plates, which are not connected through a restraining structure 102, in the supporting sub-plates. In some embodiments, the nine supporting sub-plates may be connected through the restraining structures 102 to form an S-shaped structure. Here, the gap γ is formed between the supporting sub-plate 101b and the supporting sub-plate 101e, between the supporting sub-plate 101c and the supporting sub-plate 101f, between the supporting sub-plate 101d and the supporting sub-plate 101g, and between the supporting sub-plate 101e and the supporting sub-plate 101h. The supporting plate is generally made of a metal material or a polymer with high strength, and therefore the supporting plate has high rigid intensity. When the flexible display screen is in the unfolded state, the evenness of the supporting plate at the gaps γ can be guaranteed. Generally, the narrower the gaps γ are, the better. For example, the widths of the gaps γ are generally within 0.2 mm. Small gaps can guarantee the supporting role of the supporting plate to the flexible display screen, and thereby the reliability of the display device is improved. In practice, the supporting plate may also be made of plastic, glass, etc., to guarantee the demand on rigidity, which is not limited herein.

Correspondingly, the shape of the flexible display screen 20 matches with the shape of the supporting plate 10. As shown in FIG. 2-2, a clearance γ' is formed in the position, corresponding to the gap γ, on the flexible display screen 20 on the supporting plate 10 shown in FIG. 2-1. When the nine supporting sub-plates are connected to be the S-shaped structure through the restraining structures 102, the flexible display screen 20 is also S-shaped. The clearance γ' formed in the flexible display screen may guarantee that the foldable display device can be effectively folded. The narrower the clearance γ' is, the better. Generally, the width of the clearance γ' is equal to the width of the corresponding gap γ. For example, the width of the clearance γ' is generally within 0.2 mm. The clearance γ' in the flexible display screen is small enough, and the display effect of the display device can be guaranteed when the flexible display screen is in the unfolded state.

It should be noted that in order to guarantee effective folding of the supporting plate, as shown in a locally enlarged area A of the supporting plate in FIG. 2-1, the width x of the restraining structure is smaller than the width y of the supporting sub-plate connected by the restraining structure. Therefore, when the supporting plate 10 comprises at least four supporting sub-plates arranged in a matrix, an opening g as shown in FIG. 2-1 may be formed between every four supporting sub-plates arranged in a matrix and the restraining structures connected therewith.

The restraining structures in the present disclosure may enable the flexible display screen to bend away from the supporting plate and/or toward the supporting plate. In the embodiments of the disclosure, the following four restraining structures are taken as examples for explanation:

A first restraining structure: this restraining structure may enable the flexible display screen corresponding to two adjacent supporting sub-plates to bend away from the supporting plate (also referred to as inward-bending). As shown in FIG. 1-2, the restraining structure 102 may comprise a first flexible strap 1021 and at least two inward-bend restraining structures 1022 sleeving the first flexible strap 1021. As shown in FIG. 1-1, in each restraining structure, when the flexible display screen 20 at the restraining structure is in an unfolded state, the side, facing the flexible display screen 20, of each inward-bend restraining structure 1022 at the restraining structure is a plane and may be attached to the flexible display screen to play a supporting role on the flexible display screen. As shown in FIG. 1-2, when the flexible display screen 20 at the restraining structure is bent to a preset angle away from the supporting plate 10, the sides, facing the flexible display screen 20, of all the inward-bend restraining structures 1022 at the restraining structure may be combined to form a curved surface of which the bending degree matches with that of the flexible display screen 20 The curved surface may be partially or totally attached to the flexible display screen.

As shown in FIG. 1-3, each of the inward-bend restraining structures 1022 may comprise: a first cubic structure 1022a and a first quad-prismoid 1022b arranged on the first surface of the first cubic structure 1022a. The bottom surface with a larger area of two bottom surfaces of the first quad-prismoid 1022b is connected with the first surface of the first cubic structure 1022a. In some embodiments, the bottom surface with a larger area of the two bottom surfaces of the first quad-prismoid 1022b is attached to the first surface of the first cubic structure 1022a, and the bottom surface with a smaller area is in contact with the flexible display screen 20. The first longitudinal section of the first quad-prismoid 1022b is trapezoidal. The first longitudinal section is a section parallel to the extending direction of the first flexible strap 1021 and is perpendicular to the display surface of the flexible display screen. In practice, each of the inward-bend restraining structures 1022 is manufactured integrally.

In some embodiments, to improve the stability of a bendable device which is bent inward, a buckling structure for instance a buckle, may be arranged between the first quad-prismoids in the adjacent two inward-bend restraining structures. A bulge and a groove may also be correspondingly and respectively formed in the attaching faces of the two first quad-prismoids when the flexible display screen is bent inward. When the side surfaces of the two first quad-prismoids are attached to each other, the bulge of one of the first quadrangular structures may be clamped with the groove of the other one. Therefore, the stability of the folded display device is improved.

In some embodiments, the first longitudinal section of the first quad-prismoid is in the shape of an isosceles trapezoid, of which the base angles are greater than 72 degrees. When the flexible display screen is bent away from the supporting plate, the smaller the base angles of the trapezoids are, the smaller the bending radius R1 of the supporting plate as shown in FIG. 1-2 is (the smaller the bending radius of the flexible display screen is), and the smaller the thickness of the folded display device is. However, the bending radius of the flexible display screen is in a negative correlation with its bending angle. That is, the smaller the bending radius is, the larger the bending angle is. Generally, the limit value of the bending angle of the flexible display screen is 180 degrees. Here, refer to FIG. 1-2, when four inward-bend restraining structures 1022 are provided, the base angles of the isosceles trapezoids may be 72 degrees.

In some embodiments, the height of the restraining structure 102 (the height obtained after the first cubic structures are connected with the corresponding quad-prismoids) may be the same as those of the supporting sub-plates, so that when the flexible display screen is unfolded, the restraining structure may well support the flexible display screen. The evenness of the flexible display screen in the display device is guaranteed.

It should be noted that the side surface of the supporting sub-plate connected with the inward-bend restraining structure may comprise: a first inclined plane L1 and a first vertical plane H1. In practice, as shown in FIG. 1-2, when the flexible display screen is bent away from the supporting plate, the first inclined plane L1 is attached to the side surface of the first quad-prismoid 1022b. When the flexible display screen is in an unfolded state as shown in in FIG. 1-3, the first vertical plane H1 is attached to the side surface of the first cubic structure 1022a, such that the display device 00 may bend from 0 degree to 180 degrees.

A second restraining structure: this restraining structure may enable the flexible display screen corresponding to the two adjacent supporting sub-plates to bend toward the supporting plate (also referred to as outward-bending). As shown in FIG. 3-1, the restraining structure 102 may comprise at least two outward-bend restraining structures 1024 and a second flexible strap 1023 configured to connect the adjacent outward-bend restraining structures 1024. When the flexible display screen 20 is bent toward the supporting plate until the surfaces of the two supporting sub-plates are attached to each other, the at least two outward-bend restraining structures 1024 can restrain the relative positions of the two supporting sub-plates 101. That is, the two supporting sub-plates may be fixed by the outward-bend restraining structures. The at least two outward-bend restraining structures may play a certain limiting role on the two supporting sub-plates when the flexible display screen is bent toward the supporting plate until the surfaces of the two supporting sub-plates are attached to each other. The two supporting sub-plates are prevented from slight displacement such as shaking and particularly the deflection in the horizontal direction shown in FIG. 3-1.

In some embodiments, refer to the way that the adjacent inward-bend restraining structures are connected through the first flexible strap, the way that the adjacent outward-bend restraining structures are connected through the second flexible strap may comprise the following procedures: the adjacent two supporting sub-plates are connected through the second flexible strap; the outward-bend restraining structures may sleeve the second flexible strap; or the second flexible strap may comprise a plurality of second flexible sub-straps, the adjacent two outward-bend restraining structures may be connected through one of the second flexible sub-straps; and the two outward-bend restraining structures adjacent to the supporting sub-plate are respectively connected with the supporting sub-plate through one of the second flexible sub-straps. The way for connecting the outward-bend restraining structures and the second flexible strap is not limited in the embodiments of the disclosure.

As shown in FIG. 3-2, each of the outward-bend restraining structures 1024 may comprise: a second cubic structure 1024a and a third quad-prismoid 1024b arranged on the first surface of the second cubic structure 1024a. The bottom surface, with a larger area, of two bottom surfaces of the third quad-prismoid 1024b is connected with the first surface of the second cubic structure 1024a. In some embodiments, the bottom surface with a larger area of two bottom surfaces of the third quad-prismoid 1024b is totally overlapped with the first surface of the second cubic structure 1024a. The side surface of the third quad-prismoid 1024b is propped against the target side surfaces of the two supporting sub-plates 101 when the flexible display screen 20 is bent toward the supporting plate 10 until the surfaces of the two supporting sub-plates 101 are attached to each other, as shown in FIG. 3-1. The first longitudinal section of the third quad-prismoid 1024b is trapezoidal. The first longitudinal section is a section parallel to the extending direction of the second flexible strap 1023 and is perpendicular to the display surface of the flexible display screen. In practice, each of the outward-bend restraining structures 1024 is manufactured integrally.

In some embodiments, in order to improve the stability of the bendable device which is bent outward, a buckling structure, for instance a buckle, may be arranged between the third quad-prismoids in the two adjacent outward-bend restraining structures. A bulge and a groove may be correspondingly and respectively formed in attaching faces of the two third quad-prismoids when the flexible display screen is bent outward. When side surfaces of the two third quad-prismoids are attached to each other, the bulge of one of the third quad-prismoids may be clamped with the groove of the other one. Therefore, the stability of the folded display device is improved.

It should be noted that the second surface of the second cubic structure 1024a is in contact with the flexible display screen 20. When the flexible display screen 20 is in an unfolded state, the second surface of the second cubic structure is attached to the flexible display screen. As the second cubic structure is attached to the flexible display screen, a supporting role may be played on the flexible display screen, and accordingly, undesirable display caused by collapse of the flexible display screen is avoided. When the flexible display screen is in a folded state, the second surface of the second cubic structure is in contact with a part of the flexible display screen, and the supporting role may also be played on the flexible display screen. The second surface is opposite to the first surface.

In some embodiments, the first longitudinal sections of the third quad-prismoids may be in the shape of isosceles trapezoids of which the base angles range from 60 degrees to 90 degrees. When the flexible display screen is bent toward the supporting plate, the smaller the base angles of the trapezoids are, the smaller the bending radius R2 of the supporting plate as shown in FIG. 3-1 is (the smaller the bending radius of the flexible display screen is), and the smaller the thickness of the folded display device is. However, the bending radius of the flexible display screen is in a negative correlation with its bending angle. That is, the smaller the bending radius is, the larger the bending angle is. Generally, the limit value of the bending angle of the flexible display screen is 180 degrees. When the flexible display screen is bent toward the supporting plate till the two supporting sub-plates are attached to each other, the thickness of the folded display device is minimal. That is, when the flexible display screen is bent to the limit value (180 degrees) of the bending angle, refer to FIG. 3-1, and when the number of the outward-bend restraining structures is two, the base angles of the isosceles trapezoids may be 60 degrees.

In some embodiments, the height of the restraining structure 102 (the height obtained after the second cubic structures are connected with the corresponding second quad-prismoids) may be smaller than those of the supporting sub-plates, so that the purpose of further reducing the gap between the two supporting sub-plates is achieved. Therefore, the size of the foldable display device which is folded is reduced.

It should be noted that the target side surfaces of the supporting sub-plates connected with the outward-bend restraining structures may comprise a second inclined plane L2 and a second vertical plane H2. In practical application, as shown in FIG. 3-1, when the flexible display screen is bent toward the supporting plate till the surfaces of the two supporting sub-plates are attached to each other, the second inclined plane L2 is attached to the side surface of the third quad-prismoid. When the flexible display screen is in an unfolded state, as shown in FIG. 3-2, the second vertical plane H2 is attached to the side surface of the second cubic structure 1024a. The display device 0 may be bent by 0-180 degrees.

A third restraining structure: this restraining structure ensures that the flexible display screen corresponding to the two adjacent supporting sub-plates may be bent not only away from the supporting plate but also toward the supporting plate. The restraining structure may be regarded as a structure formed by adding a second quad-prismoid on the second surface of the first cubic structure 1022a of the inward-bend restraining structure 1022 in the first restraining structure shown in FIG. 1-3. That is, the inward-bend restraining structure further comprises: a second quad-prismoid arranged on the second surface of the first cubic structure. The bottom surface with a larger area of the two bottom surface of the second quad-prismoid is connected with the second surface of the first cubic structure. The second surface is opposite to the first surface. The second longitudinal section of the second quad-prismoid is trapezoidal. Correspondingly, the target side surfaces of the supporting sub-surfaces connected with the inward-bend restraining structures comprise: a second inclined surface. When the flexible display screen is bent toward the supporting plate until the surfaces of the two supporting sub-plates are attached to each other, the second inclined surface is attached to the side surface of the second quad-prismoid.

As the inward-bend restraining structures added with the second quad-prismoids have inward and outward bending functions, this form of inward-bend restraining structure is called as a bending and restraining structure in the embodiments of the disclosure.

Figures 1, 2, 3, 4:
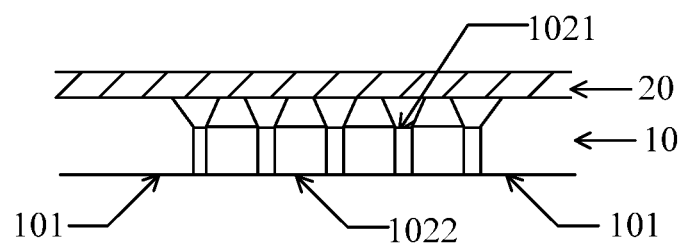
Figures 1, 2:
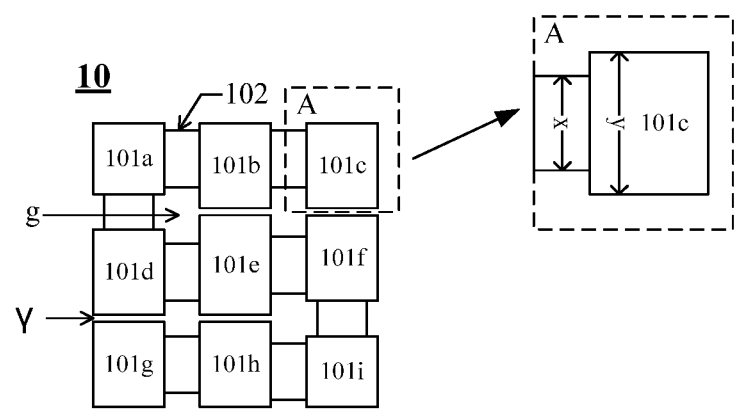
Figure 2:
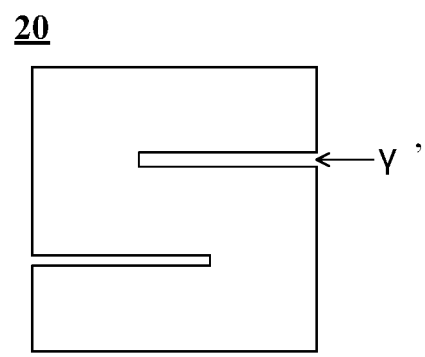
Figures 1, 3:
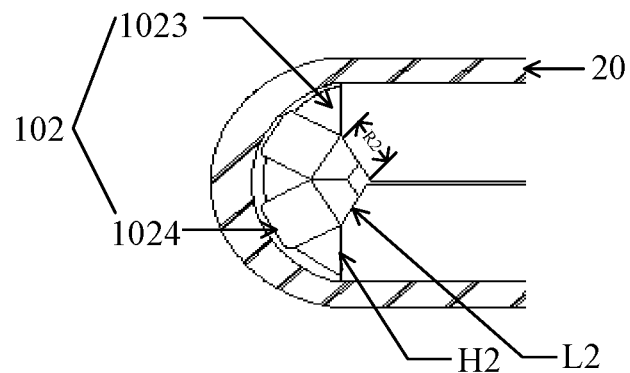
Figures 2, 3:
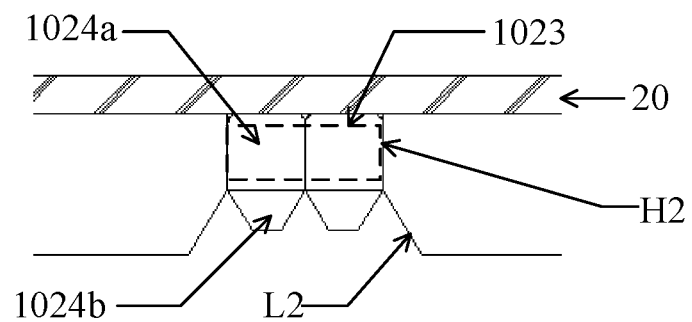
Figure 4:
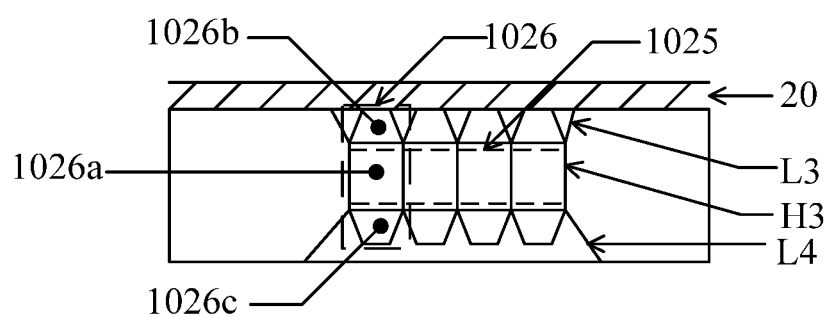

As shown in FIG. 4, the restraining structure 102 may comprises a third flexible strap 1025 and at least two bending and restraining structures 1026 sleeving the third flexible strap 1025.

As shown in FIG. 4, each bending and restraining structure 1026 may comprise a first cubic structure 1026a, a first quad-prismoid 1026b arranged on the first surface of the first cubic structure 1026a and a second quad-prismoid 1026c arranged on the second surface of the first cubic structure 1026a.

The bottom surface, with a larger area, of the two bottom surfaces of the first quad-prismoid 1026b is connected with the first surface of the first cubic structure 1026a. In some embodiments, the bottom surface, with a larger area, of the two bottom surfaces of the first quad-prismoid 1026b completely overlaps the first surface of the first cubic structure 1026a. The bottom surface with a smaller area is in contact with the flexible display screen 20. The first longitudinal section of the first quad-prismoid 1026b is trapezoidal and is a section parallel to the extending direction of the first flexible strap 1025 and perpendicular to the display surface of the flexible display screen. The bottom surface, with the larger area, of the two bottom surfaces of the second quad-prismoid 1026c is connected with the second surface of the first cubic structure 1026a. In some embodiments, the bottom surface, with a larger area, of the two bottom surfaces of the second quad-prismoid 1026c completely overlaps the second surface of the first cubic structure 1026a. The second surface is opposite to the first surface. The second longitudinal section of the second quad-prismoid 1026c is trapezoidal. The base angle of the trapezoid of the first longitudinal section of the first quad-prismoid 1026b is different from that of the trapezoid of the second longitudinal section of the second quad-prismoid 1026c.

It should be noted that the target side surface of the supporting sub-plate connected with the bending and restraining structure may comprise: a third inclined plane L3, a third vertical plane H3 and a fourth vertical plane L4. In practice, when the flexible display screen is in an unfolded state, as shown in FIG. 4, the third vertical plane H3 is attached to the side surface of the first cubic structure 1026a. When the flexible display screen is bent toward the supporting plate, the third inclined plane L3 is attached to the side surface of the first quad-prismoid 1026b. When the flexible display screen is bent toward the supporting plate until the surfaces of the two supporting sub-plates are attached to each other, the fourth inclined plane L4 is attached to the side surface of the second quad-prismoid 1026c.

In some embodiments, the structure of the first quad-prismoid in FIG. 4 may be made reference to the structure of the first quad-prismoid in FIG. 1-3, and the structure of the second quad-prismoid in FIG. 4 may be made reference to the structure of the second quad-prismoid in FIG. 3-2, which are not repeated here.

Figure 5:
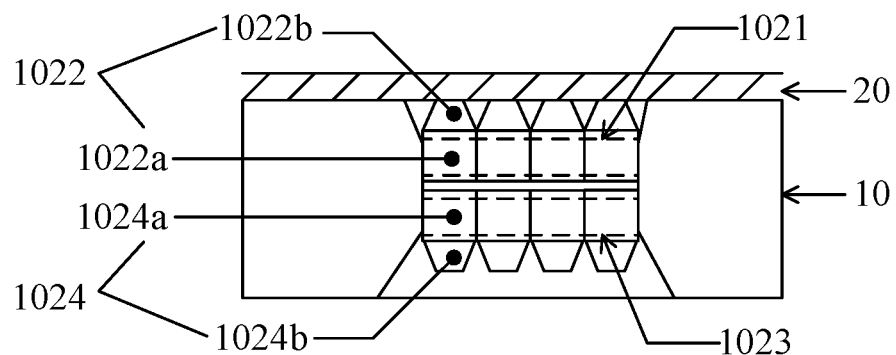
FIG. 5 is a structural schematic diagram of still yet another foldable display device provided in an embodiment of the present disclosure.

A fourth restraining structure: this restraining structure ensures that the flexible display screen corresponding to the two adjacent supporting sub-plates may be bent not only away from the supporting plate but also toward the supporting plate. As shown in FIG. 5, the restraining structure 102 may comprise at least two inward-bend restraining structures 1022, a first flexible strap 1021 configured to connect the adjacent inward-bend restraining structures 1022, at least two outward-bend restraining structures 1024, and a second flexible strap 1023 configured to connect the adjacent outward-bend restraining structures 1024. The first flexible strap is parallel to the second flexible strap.

In some embodiments, the way for connecting the inward-bend restraining structures and the first flexible strap may refer to the specific ways in the embodiments of the first restraining structure, and the way for connecting the outward-bend restraining structures and the second flexible strap may refer to the specific ways in the embodiments of the second restraining structure, which will not be repeated herein.

Each of the inward-bend restraining structures 1022 may comprise a first cubic structure 1022a and a first quad-prismoid 1022b arranged on the first surface of the first cubic structure 1022a. The bottom surface, with a larger area, of the two bottom surfaces of the first quad-prismoid 1022b is connected with the first surface of the first cubic structure 1022a, and the bottom surface with a smaller area is in contact with the flexible display screen 20. In some embodiments, the bottom surface with a larger area of the two bottom surfaces of the first quad-prismoid 1022b totally overlaps the first surface of the first cubic structure 1022a. Each of the outward-bend restraining structures 1024 may comprise a second cubic structure 1024a and a third quad-prismoid 1024b arranged on the first surface of the second cubic structure 1024a. The bottom surface with a larger area of the two bottom surfaces of the third quad-prismoid 1024b is connected with the first surface of the second cubic structure 1024a. In some embodiments, the bottom surface with a larger area of the two bottom surfaces of the third quad-prismoid 1024b totally overlaps the first surface of the second cubic structure 1024a. When the flexible display screen 20 is bent toward the supporting plate 10 until the surfaces of the two supporting sub-plates 101 are attached to each other, the side surface of the third quad-prismoid 1024b propped against the target surfaces of the two supporting sub-plates 101. The first surface of the second cubic structure 1024a is a surface way from the flexible display screen.

It should be noted that a gap is formed between the second surface of the first cubic structure and the second surface of the second cubic structure so as to ensure that the supporting plate may be effectively folded. The second surface of the first cubic structure is opposite to the first surface of the first cubic structure, and the second surface of the second cubic structure is opposite to the first surface of the second cubic structure.

In some embodiments, the specific structure of the inward-bend restraining structure may refer to the first restraining structure, and the specific structure of the outward-bend restraining structure may refer to the second restraining structure, which will not be repeated herein.

Known from the four restraining structures, the design of the restraining structure between the supporting sub-plates meet the demands for different bending directions and bending radii of the flexible display screen, as well as the demand for evenness of the foldable display device after it is unfolded.

Figures 1, 6:
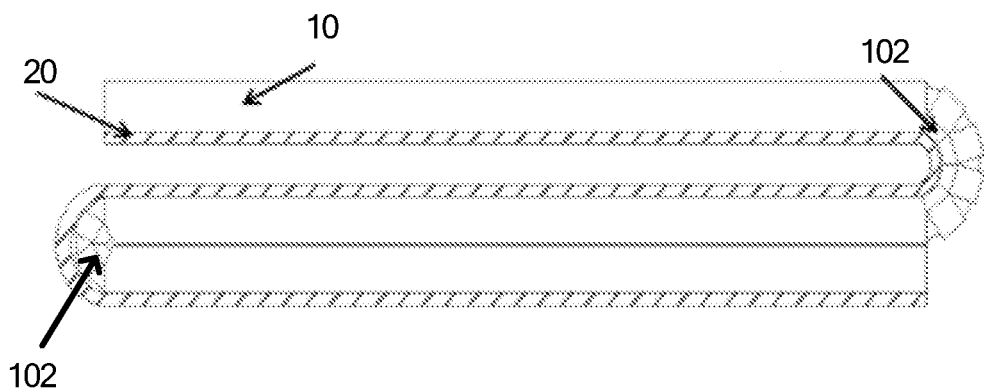
Figures 2, 6:
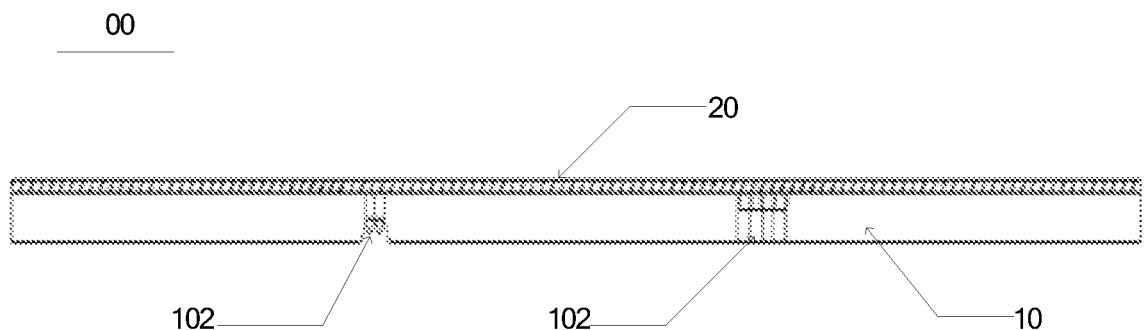

In practice, the supporting plate comprises a plurality of supporting sub-plates and a plurality of restraining structures. The plurality of restraining structures may adopt either only one of or at least two of the above restraining structures. As shown in FIG. 6-1 and FIG. 6-2, assuming that the plurality of restraining structures in the foldable display device 00 adopt the first restraining structure and the second restraining structure, the FIG. 6-1 is a structural schematic view of the foldable display device 00 after it is folded, and FIG. 6-2 is a structural schematic view of the foldable display device 00 after it is unfolded.

Figures 1, 7:
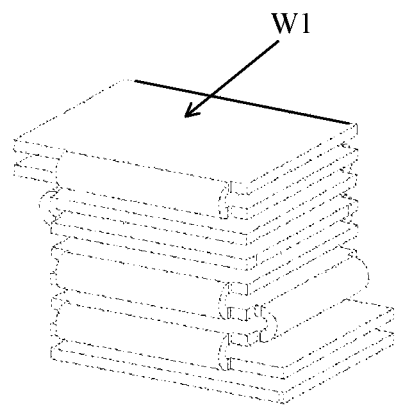
Figures 2, 7:
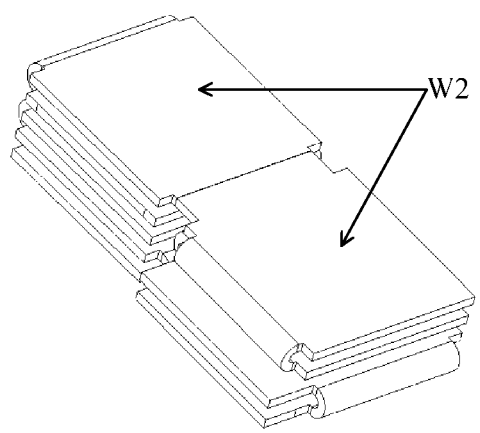
Figures 3, 7:
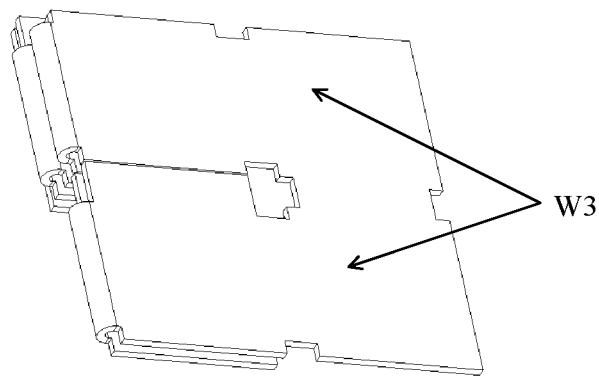
Figures 4, 7:
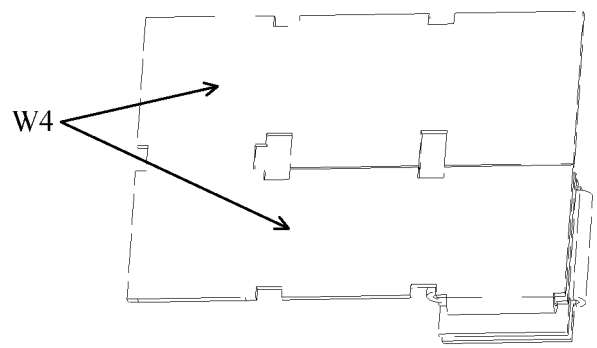

It should be noted that when the flexible display screen is in an unfolded state, if the supporting plate comprises a plurality of supporting sub-plates arranged in a matrix, the plurality of supporting sub-plates may comprise n-row and m-column supporting sub-plates, and both m and n are integers greater than 1. Thus, the foldable display device in the embodiments of the present disclosure may be folded in various ways to realize display of display interfaces of different sizes. The area of the display interface may be larger than or equal to the area of one supporting sub-plate and smaller than or equal to the areas of m*n+1 supporting sub-plates. Exemplarily, the area of the display interface after the foldable display device is completely folded are approximately equal to the area of one supporting sub-plate, and the area of the display interface after the foldable display device is totally unfolded is approximately equal to the areas of m*n supporting sub-plates, and is generally slightly larger than the areas of the m*n supporting sub-plates. Exemplarily, taking the foldable display device with 3*3 supporting sub-plates for example, as shown in FIG. 7-1, when the display device is completely folded, the area of the display interface W1 is approximately equal to the area of one supporting sub-plate. Besides, the display device may be partially folded to realize the image display on the display interfaces on 1*2 supporting sub-plates as shown in FIG. 7-2 (the display interfaces are W2), the image display on the display interfaces on 2*2 supporting sub-plates as shown in FIG. 7-3 (the display interfaces are W3), the image display on the display interfaces on 2*3 supporting sub-plates as shown in FIG. 7-4 (the display interfaces are W4), etc. The display area may be adjusted in accordance with actual demands of users to satisfy various demands of the users. The display interfaces with larger sizes can meet the demand for big-screen display of the users. The display interfaces with smaller sizes may reduce the power consumption and thereby the life time of the foldable display device can be prolonged.

Exemplarily, the foldable display device may be an electronic map including 3*3 supporting sub-plates. When the electronic map is completely unfolded, the flexible display screen displays the map of XX country. The flexible display screen on the 1*2 supporting sub-plates obtained after folding displays the map of a certain region of the XX country, for example, the map of a province. The flexible display screen on the 1*1 supporting sub-plates obtained after folding displays the map of a smaller region, for example, the map of a city.

It should be noted that the plurality of supporting sub-plates in the supporting plate provided in the embodiments of the disclosure may have equal or unequal areas, which is not limited herein, so long as the supporting plate is foldable.

In some embodiments, the flexible display screen may be a transparent screen, generally an organic light-emitting diode (OLED) screen. A Preset pattern may be formed on the side, close to the flexible display screen, of the supporting plate. The patterns on the supporting plate may be formed through vapor deposition, coating and lamination of a film layer or through a patterning process on the supporting plate. The flexible display screen may display the patterns while not displaying images, so that the interestingness of the display device is improved. The patterns may be user-defined before the manufacture of the foldable display device, so that the patterns are customized.

In some embodiments, the supporting plate and the restraining structures may be made of transparent materials, so that the display device is of a transparent structure on the whole. Thus, its customer loyalty is improved.

The flexible display screen of any one of the foldable display devices in FIGS. 1-1 to 1-4 and FIGS. 3-1 to 7-4 may be equipped with a signal input port. When an external display signal is input from the signal input port, image display can be performed, and thereby the function of the display device is achieved.

Figures 1, 8:
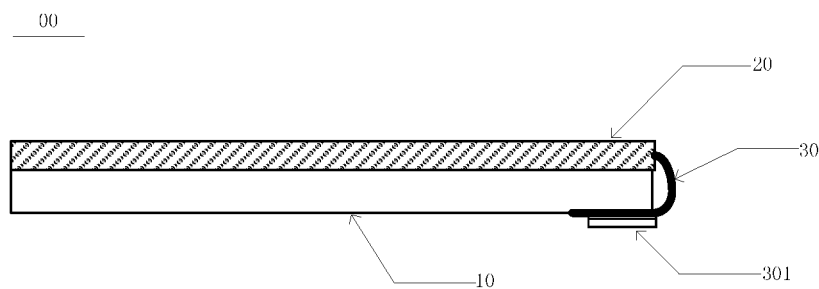
Figures 2, 8:
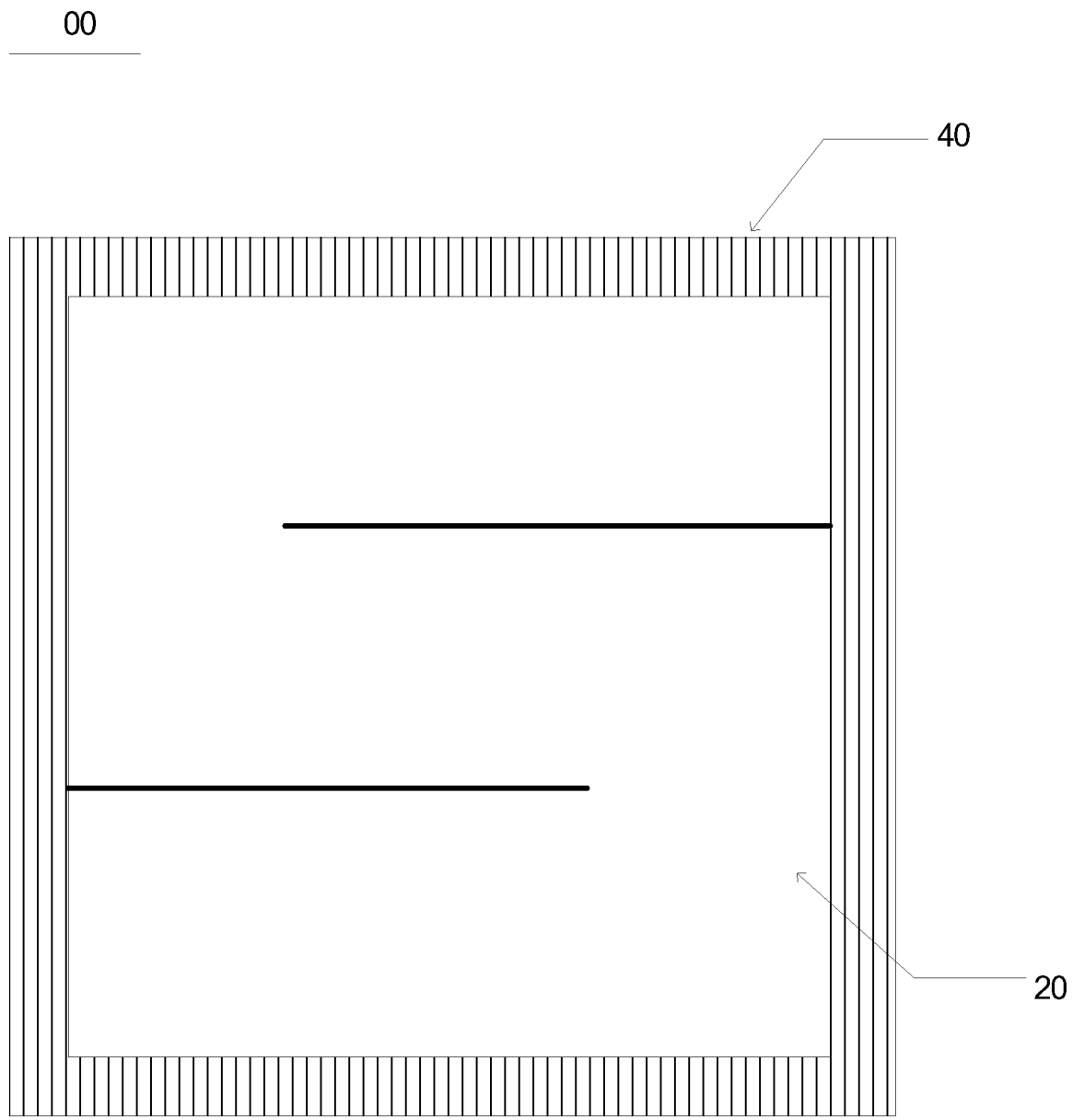
Figures 3, 8:
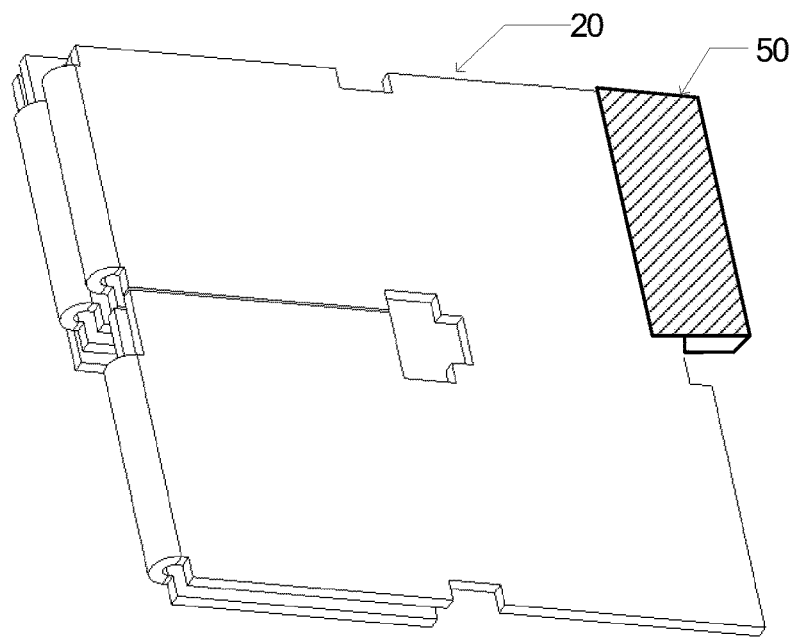
Figures 4, 8:
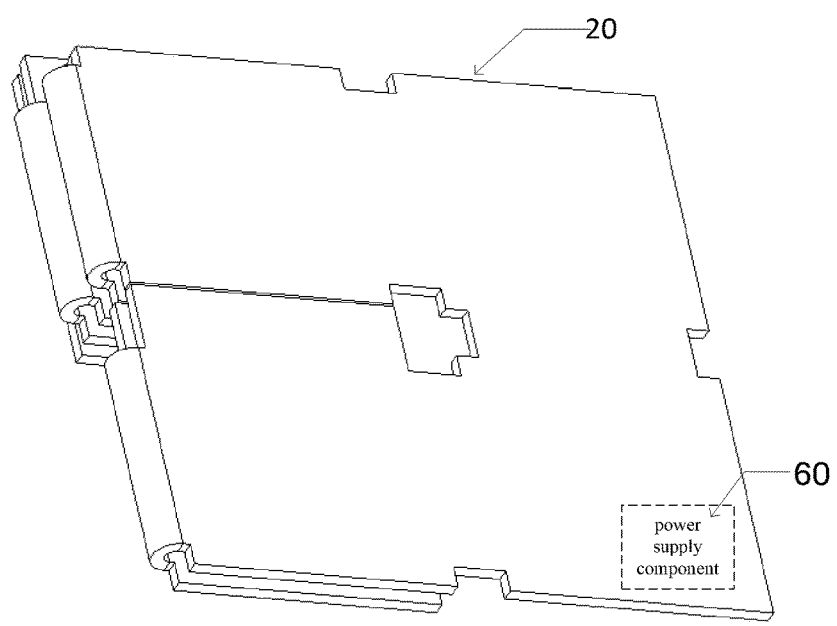

In practice, the foldable display device may integrate a display driving function and perform image display under the drive of the display signal per se. The foldable display device integrating the display driving function may have various implementation modes. In the embodiments of the present disclosure, the following two implementation modes are taken as examples for explanation:

A first implementation mode: as shown in FIG. 8-1, the foldable display device 00 further comprises a flexible printed circuit (FPC) 30 on which a driver control chip 301 of the flexible display screen 20 is arranged. One end of the FPC 30 is electrically connected with one side of the flexible display screen 20, and the other end thereof is bent to the side, away from the flexible display screen 20, of the supporting plate 10. In some embodiments, the FPC 30 may be electrically connected with one side of the flexible display screen 20 through a connector. The driver control chip 301 may output a display signal to the flexible display screen 20 to drive the flexible display screen 20 to display images. Exemplarily, the driver control chip may be provided with a memory configured to store image data to be displayed.

It should be noted that as shown in FIG. 8-2, the foldable display device 00 may further comprise a flexible protection shell 40, which coats the supporting plate (not shown in FIG. 7-2), the FPC (not shown in FIG. 7-2) and the edge of the flexible display screen 20. The flexible protection shell 40 can effectively protect the supporting plate, the FPC and the flexible display screen 20 against damage. Exemplarily, the protection shell may be a detachable protection shell. After the flexible display screen 20 is unfolded (in an unfolded state) in the mode shown in FIG. 8-2, the protection shell may be mounted outside the supporting plate, the FPC, the flexible display screen, etc. which are mutually connected. When the flexible display screen needs to be folded, the protection shell may be detached. Or, the protection shell is a housing with one end opened. The area of the bottom surface of the protection shell is slightly larger than that of one supporting sub-plate. The depth of the protection shell is larger than the sum of the thickness of m*n supporting sub-plates and the thickness of m*n flexible display screens. When the flexible display screen is completely folded into the shape, for example shown in FIG. 7-1, the supporting plate, the FPC and the flexible display screen which are mutually connected may be placed in the protection shell through the opening of the protection shell. When the flexible display screen needs to be unfolded, the supporting plate, the FPC and the flexible display screen which are mutually connected can be taken out.

Furthermore, foam may be arranged in the flexible protection shell 40 to play a buffering role, so that the FPC, the flexible display screen, etc. can be prevented from damages. In the second implementation mode, as shown in FIG. 8-3, the foldable display device further comprises a signal output component 50 with a signal output port in a detachable connection with the signal input port of the flexible display screen 20. The signal output component 50 is configured to provide the flexible display screen 20 with a display signal. It should be noted that the size of the signal output component 50 may matches with the size of the foldable display device. In some embodiments, the length of the signal output component 50 may be an integer multiple of the length or width of one supporting sub-plate. For example, the length of the signal output component 50 may be equal to the length or width of one supporting sub-plate.

Furthermore, as shown in FIG. 8-4, the foldable display device 00 may further comprise a power supply component 60 configured to supply power for the flexible display screen. The power supply component 60 may comprise a power input port connected with an external power supply and/or a power supply battery. When the power supply component 60 comprises a power input port, the power input port may be arranged on one side surface of the flexible display screen and may be a universal serial bus (USB)

interface. When the power supply component 60 comprises a power supply battery, the power supply battery may be arranged at the back (the side away from the flexible display screen) of a certain supporting plate, and may be a lithium battery.

Besides, the foldable display device provided by the embodiments of the disclosure further comprises a control component configured to display a prompt message through the flexible display screen. The prompt message prompts users to select a current display mode from various display modes of the flexible display screen, and controls the flexible display screen to display images in the current display mode after the current display mode selected by the users is received. Thus, the users can select the display modes, and the user experience is improved. The various display modes are in a one-to-one correspondence with the various display interfaces supported by the flexible display screen. For example, the display interfaces on x*y supporting sub-plates correspond to x*y display mode. In the x*y display mode, the display interfaces on the corresponding x*y supporting sub-plates in the flexible display screen display images while other interfaces do not display images, wherein $1 \leq x \leq m$, $1 \leq y \leq n$, m represents the total row number of the supporting sub-plates in the foldable display device, and n represents the total column number of the supporting sub-plates in the foldable display device.

Taking FIG. 7-2 for an example, the display interfaces on the 1*2 supporting sub-plates correspond to a 1*2 display mode. In the 1*2 display mode, the display interfaces on the corresponding 1*2 supporting sub-plates in the flexible display screen display images while other interfaces do not display images.

Certainly, the control component may also be configured to determine the current display interface based on the folding mode of the flexible display screen, so that automatic adaptation of the display modes can be realized, and the user experience is improved. The control component also controls the flexible display screen to adopt the current display mode corresponding to the current display interface to display images. The current display mode is determined among the various display modes. The various display modes may refer to the above explanation, which will not be repeated herein.

Still taking FIG. 7-2 for an example, when the control component determines that the current display interface is display interfaces on the 1*2 supporting sub-plates based on the folding mode of the flexible display screen, a 1*2 display mode corresponding to the display interface is determined. In the 1*2 display mode, the display interfaces on the 1*2 supporting sub-plates in the flexible display screen display images while other interfaces do not display images.

In practice, the control component may be a processor or a processing chip. The control component may be arranged at the back of a supporting sub-plate and be electrically connected with the flexible display screen. Of course, when the foldable display device comprises a FPC, the control component may be arranged on the side of the FPC, which is bent till the supporting plate is away from the flexible display screen.

The foldable display device provided in the embodiments of the present disclosure may be an electronic map, an electronic paper, a mobile phone, a tablet computer, a display, a laptop computer, a wearable device or any other product or part with a foldable display function.

Figure 9:
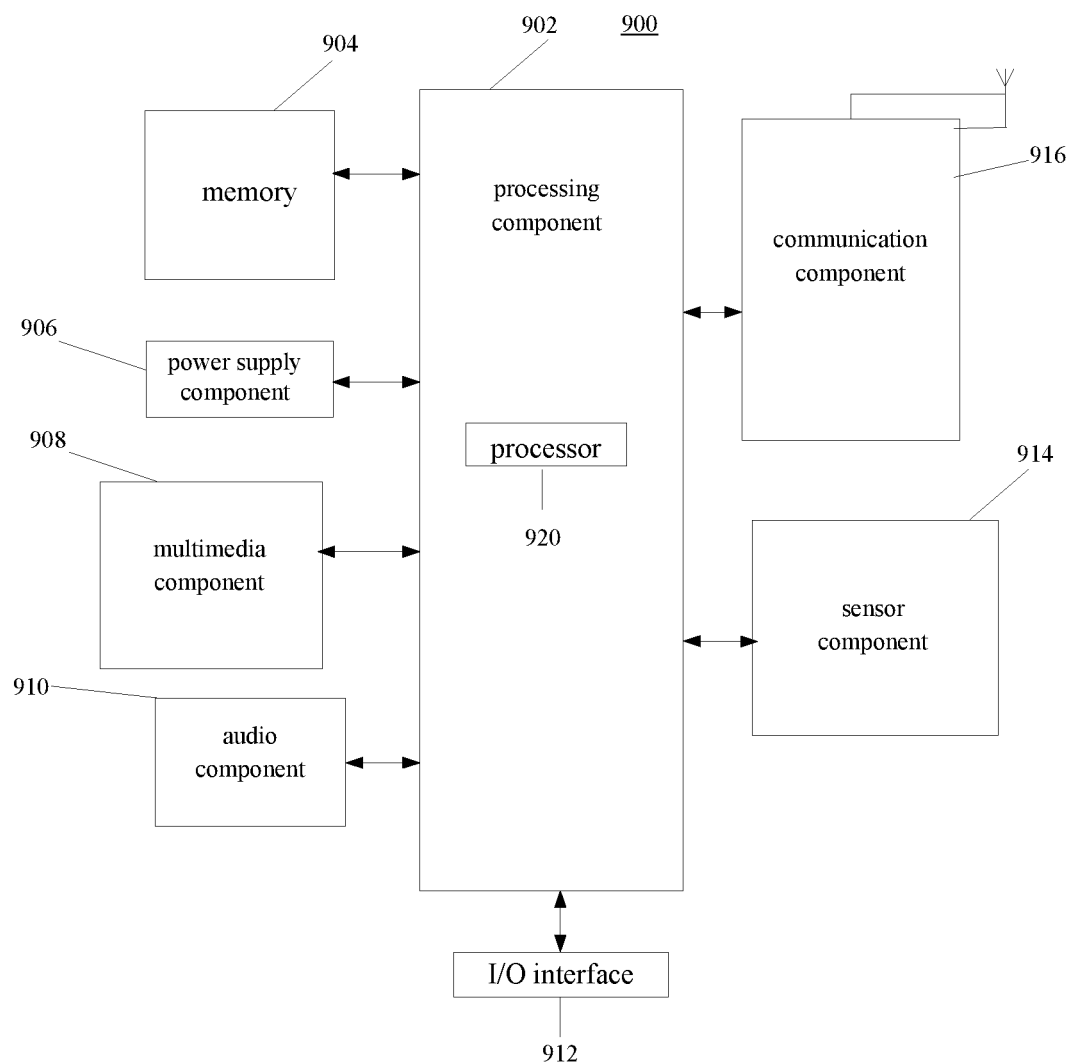
FIG. 9 is a block diagram of a foldable display device provided in an exemplary embodiment of the present disclosure.

FIG. 9 is a block diagram of a foldable display device 900 shown in accordance with an exemplary embodiment. The foldable display device 900 may be the same device as the above foldable display device 00. Referring to FIG. 9, the device 900 includes one or more of the following components: a processing component 902, a memory 904, a power supply component 906, a multimedia component 908, an audio component 910, an input/output (I/O) interface 912, a sensor component 914, and a communication component 916.

The processing component 902 generally may control the overall operation of the device 900, such as operations associated with display, phone call, data communication, camera operation, and recording operation. The processing component 902 may include one or more processors 920 to execute instructions. In addition, the processing component 902 may include one or more modules to facilitate the interactions between the processing component 902 and other components. For example, the processing component 902 may include a multimedia module to facilitate interaction between the multimedia component 908 and the processing component 902.

The memory 904 may be configured to store various types of data to support the operation of the device 900. Examples of such data can include instructions of any application or method operating on the device 900, contact data, phonebook data, messages, pictures, videos, and the like. The memory 904 may be implemented by any type of volatile or nonvolatile memory device or a combination thereof, such as static random access memory (SRAM), electrically erasable programmable read only memory (EEPROM), erasable programmable read only memory (EPROM), programmable read only memory (PROM), read only memory (ROM), magnetic memory, flash memory, disk or CD.

The power supply component 906 may provide power to the various components of the device 900. The power supply component 906 may include a power management system, one or more power supplies, and other components associated with generating, managing, and distributing power for the device 900.

The multimedia component 908 may include a screen providing an output interface between the device 900 and the user. In some embodiments, the screen may include the above flexible display device and a touch panel (TP). If the screen includes a touch panel, the screen may be implemented as a touch screen to receive input signals from the user. The touch panel may include one or more touch sensors to sense touches, slides, and gestures on the touch panel. The touch sensors may sense not only the boundary of the touch or slide actions, but also the duration and pressure associated with the touch or slide operation. In some embodiments, the multimedia component 908 may include a front camera and/or a rear camera. When the device 900 is in an operating mode, such as a shooting mode or a video mode, the front camera and/or the rear camera can receive external multimedia data. Each front camera and rear camera can be a fixed optical lens system or have focal length and optical zoom capability.

The audio component 910 may be configured to output and/or input an audio signal. For example, the audio component 910 may include a microphone (MIC) that is configured to receive external audio signals when the device 900 is in the operating mode, such as a call mode, a recording mode, and a voice recognition mode. The received audio signals may be further stored in the memory 904 or transmitted via the communication component 916. In some embodiments, the audio component 910 can also include a speaker for outputting the audio signals.

The I/O interface 912 may provide an interface between the processing component 902 and a peripheral interface module. The peripheral interface module may be a keyboard, a mouse, a button, or the like. The button may include, but is not limited to, a home button, a volume button, a start button, and a lock button.

The sensor component 914 may include one or more sensors for providing condition assessments of the various aspects of the device 900. For example, the sensor component 914 may detect the on/off state of the device 900, the relative positioning of the components. For example, the components may be a display and a keypad of the device 900. The sensor component 914 may also detect position changes of the device 900 or any component thereof, presence or absence of the user contact with the device 900, orientation, acceleration/deceleration, or the temperature changes of the device 900. The sensor component 914 may include a proximity sensor configured to detect the presence of a nearby object without any physical contact. The sensor component 914 may also include a light sensor, such as a CMOS or CCD image sensor, for imaging applications. In some embodiments, the sensor component 914 may also include acceleration sensors, gyro sensors, magnetic sensors, pressure sensors, or temperature sensors.

The communication component 916 may be configured to facilitate wired or wireless communication between the device 900 and other devices. The device 900 may access a wireless network based on a communication standard, such as WiFi, 2G or 3G or a combination thereof. In an exemplary embodiment, the communication component 916 may receive broadcast signals or broadcast-related information from an external broadcast management system via broadcast channels. In an exemplary embodiment, the communication component 916 can also include a near field communication (NFC) module to facilitate short-range communication. For example, the NFC module may be implemented based on radio frequency identification (RFID) technology, infrared data association (IrDA) technology, ultra wideband (UWB) technology, Bluetooth (BT) technology and other techniques.

In an exemplary embodiment, the device 900 may be implemented by one or more application specific integrated circuits (ASICs), digital signal processors (DSPs), digital signal processing devices (DSPDs), programmable logic devices (PLDs), field programmable gate array (FPGA), a controller, a microcontroller, a microprocessor, or other electronic components.

In conclusion, in accordance with the foldable display device provided in the embodiments of the disclosure, when the flexible display screen is bent to a preset angle away from the supporting plate, two sides of the at least two inward-bend restraining structures are propped against the supporting sub-plates, so that when the flexible display screen is bent to a certain degree, the at least two inward-bend restraining structures perform restraint to avoid excessive bending. Therefore, damages to the flexible display screen may be reduced and the life time of the flexible display device is prolonged.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A foldable display device, comprising a supporting plate and a flexible display screen arranged on the supporting plate, wherein
    the supporting plate comprises at least two supporting sub-plates and at least one restraining structure, wherein the restraining structure is configured to connect target side surfaces of adjacent supporting sub-plates, and the target side surfaces are lateral surfaces at edges of the flexible display screen;
    the at least two supporting sub-plates comprise a plurality of supporting sub-plates arranged in a matrix when the flexible display screen is in an unfolded state, the plurality of supporting sub-plates comprise n-row and m-column supporting sub-plates and both m and n are integers greater than 1; when the flexible display screen is in the unfolded state, a gap is formed between two adjacent supporting sub-plates, which are not connected through the restraining structure, of the supporting sub-plates, and clearances are formed in positions on the flexible display screen corresponding to the gaps;
    the widths of the restraining structures are smaller than the widths of the supporting sub-plates which are connected through the restraining structures; and
    the restraining structure comprises at least two sub restraining structures and a first flexible strap configured to connect adjacent sub restraining structures; the at least two sub restraining structures are capable of restraining relative positions of the adjacent supporting sub-plates.

2. The foldable display device of claim 1, wherein in each of the sub restraining structure:
    when the flexible display screen at the restraining structure is in an unfolded state, the side, facing the flexible display screen, of each of the sub restraining structure at the restraining structure is in a plane; and when the flexible display screen at the restraining structure is bent away from the supporting plate, the sides, facing the flexible display screen, of all the sub restraining structures in the restraining structure are combined to form a curved surface of which the bending degree matches with the bending degree of the flexible display screen.

3. The foldable display device of claim 2, wherein each of the sub restraining structures comprises a first cubic structure and a first quad-prismoid arranged on a first surface of the first cubic structure, wherein a bottom surface, with a larger area, of two bottom surfaces of the first quad-prismoid is connected with the first surface of the first cubic structure; the bottom surface with a smaller area is in contact with the flexible display screen; a first longitudinal section of the first quad-prismoid is trapezoidal, and the first longitudinal section is a section parallel to the extending direction of the first flexible strap and perpendicular to the display surface of the flexible display screen.

4. The foldable display device of claim 3, wherein the first longitudinal section of the first quad-prismoid is in the shape of an isosceles trapezoid of which base angles are greater than 72.

5. The foldable display device of claim 3, wherein the target side surface of the supporting sub-plate connected with the sub restraining structure comprises a first inclined plane and a first vertical plane; when the flexible display screen is bent away from the supporting plate, the first inclined plane is attached to a side surface of the first quad-prismoid; and when the flexible display screen is in an unfolded state, the first vertical plane are attached to a side surface of the first cubic structure.

6. The foldable display device of claim 3, wherein each of the sub restraining structure further comprises a second quad-prismoid arranged on a second surface of the first cubic structure; a bottom surface, with a larger area, of two bottom surfaces of the second quad-prismoid is connected with the second surface of the first cubic structure; the second surface is opposite to the first surface; a second longitudinal section of the quad-prismoid is trapezoidal; and the target side surface of the supporting sub-plate connected with the sub restraining structure comprises a second inclined plane, which is attached to a side surface of the second quad-prismoid when the flexible display screen is bent toward the supporting plate fill the surfaces of the two supporting sub-plates are attached to each other.

7. The foldable display device of claim 1, wherein each of the sub restraining structures comprises a second cubic structure and a third quad-prismoid arranged on a first surface of the second cubic structure; a bottom surface, with a larger area, of two bottom surfaces of the third quad-prismoid is connected with the first surface of the second cubic structure; a side surface of the third quad-prismoid is propped against the target side surfaces of the two supporting sub-plates when the flexible display screen is bent toward the supporting plate until the surfaces of the two supporting sub-plates are attached to each other; a first longitudinal section of the third quad-prismoid is trapezoidal; and the first longitudinal section is a section parallel to the extending direction of the second flexible strap and perpendicular to the display surface of the flexible display screen.

8. The foldable display device of claim 7, wherein a second surface of the second cubic structure is in contact with the flexible display screen and is opposite to the first surface.

9. The foldable display device of claim 7, wherein a trapezoid formed by the first longitudinal section of the third quad-prismoid is an isosceles trapezoid of which base angles range from 60 degrees to 90 degrees.

10. The foldable display device of claim 7, wherein the target side surface of the supporting sub-plate connected with the sub restraining structure comprises a third inclined plane and a second vertical plane; when the flexible display screen is bent toward the supporting plate until the surfaces of the two supporting sub-plates are attached to each other, the second inclined plane is attached to a side surface of the third quad-prismoid; and when the flexible display screen is in an unfolded state, the second vertical plane is attached to a side surface of the second cubic structure.

11. The foldable display device of claim 1, wherein the plurality of supporting sub-plates are connected through the restraining structures to form an S-shaped structure.

12. The foldable display device of claim 1, wherein the flexible display screen is a transparent screen, and a preset pattern is formed on a side, close to the flexible display screen, of the supporting plate.

13. The foldable display device of claim 12, wherein the supporting plate and the restraining structures are made of a transparent material.

14. The foldable display device of claim 1, further comprising a flexible printed circuit (FPC), wherein a driver control chip of the flexible display screen is arranged on the FPC; one end of the FPC is electrically connected with one side of the flexible display screen; and the other end of the FPC is bent one the side, away from the flexible display screen, of the supporting plate.

15. The foldable display device of claim 14, further comprising a flexible protective shell, which coats the supporting plate, the FPC and the edge of the flexible display screen.

16. The foldable display device of claim 1, further comprising a signal output component, wherein the signal output component is provided with a signal output port; the signal output port is in a detachable connection with a signal input port of the flexible display screen; and the signal output component is configured to provide the flexible display screen with a display signal.

17. The foldable display device of claim 1, further comprising a power supply component configured to supply power for the flexible display screen.

18. The foldable display device of claim 17, wherein the power supply component comprises a power input port connected with an external power supply; and/or a power supply battery.

* * * * *